(12) United States Patent
Tokailin et al.

(10) Patent No.: US 6,995,507 B2
(45) Date of Patent: Feb. 7, 2006

(54) METHOD FOR DEPOSITING THIN FILM FOR ELEMENT, AND ORGANIC ELECTROLUMINESCENCE ELEMENT

(75) Inventors: Hiroshi Tokailin, Sodegaura (JP); Yoshikazu Nagasaki, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 332 days.

(21) Appl. No.: 10/608,138

(22) Filed: Jun. 30, 2003

(65) Prior Publication Data
US 2004/0096694 A1 May 20, 2004

Related U.S. Application Data

(62) Division of application No. 09/959,655, filed on Nov. 2, 2001, now Pat. No. 6,649,210.

(30) Foreign Application Priority Data
Mar. 30, 2000 (JP) ............................. 2000-094449

(51) Int. Cl.
*H05B 33/00* (2006.01)
(52) U.S. Cl. ..................................... 313/504; 428/917
(58) Field of Classification Search ................ 313/504, 313/506; 428/609, 917; 315/169.3; 345/45, 345/76
See application file for complete search history.

(56) References Cited

U.S. PATENT DOCUMENTS

| 5,288,515 | A | | 2/1994 | Nakamura et al. ............. 427/58 |
| 5,674,813 | A | | 10/1997 | Nakamura et al. ........... 505/473 |
| 5,780,174 | A | * | 7/1998 | Tokito et al. ................ 428/690 |
| 6,142,097 | A | | 11/2000 | Tomofuji |
| 6,411,019 | B1 | * | 6/2002 | Hofstra et al. .............. 313/112 |
| 6,528,942 | B1 | * | 3/2003 | Tada et al. ................... 313/506 |
| 6,597,109 | B1 | * | 7/2003 | Arai et al. ................... 313/506 |

FOREIGN PATENT DOCUMENTS

| JP | 06-093426 | 4/1994 |
| JP | 10-335062 | 12/1996 |
| JP | 10-330917 | 12/1998 |
| JP | 11-106901 | 4/1999 |
| JP | 11-200022 | 7/1999 |
| JP | 2000-160328 | 6/2000 |

* cited by examiner

*Primary Examiner*—Ashok Patel
(74) *Attorney, Agent, or Firm*—Steptoe & Johnson LLP (57) ABSTRACT

The present invention concerns a method of forming one or more thin films on a substrate by depositing two or more materials by vacuum evaporation, comprising, depositing each material under such control that ni value of the each material is k±0.5 wherein k is a constant from 2 to 5, when relationship between a deposition position and a film thickness of a material i on the substrate is approximated by the following equation (1):

$$D_i/D_{0i} \propto (L_0/L_i)^3 \cos^{ni}\theta_i \qquad (1)$$

wherein $L_0$ is a distance from an evaporation source to a plane of the substrate in a perpendicular direction, $D_{0i}$ is a film thickness of the material i at an intersection point of a perpendicular line from the evaporation source to the plane of the substrate, and $D_i$ is a film thickness of the material i at a position on the substrate which is apart from the evaporation source by a distance $L_i$ in a direction of an angle $\theta_i$ against the perpendicular line. By the method, a homogenous thin film layer for an element can be formed even on a substrate having large screen.

7 Claims, 2 Drawing Sheets

METHOD FOR DEPOSITING THIN FILM FOR ELEMENT, AND ORGANIC ELECTROLUMINESCENCE ELEMENT

This application is a divisional of U.S. patent application Ser. No. 09/959,655, which is now issued as U.S. Pat. No. 6,649,210, which is a national stage entry of PCT/JP01/02455, with a international filing date Mar. 27, 2001.

TECHNICAL FIELD

The present invention relates to a method for depositing a thin film layer for an element, and an organic electroluminescence element (referred to as an organic EL element), specifically to a method for depositing a thin layer/thin film layers for an element, comprising depositing two or more materials to be deposited (referred to as a material) by vacuum evaporation, so as to form one or more thin layers superior in homogeneity on a substrate to be deposited (referred to as a substrate), and an organic EL element produced by this film-depositing method.

BACKGROUND ART

Recently, for display and so on, attention has been paid to organic EL elements and they have been researched. In general, organic EL elements basically have a transparent electrode (anode), a luminous layer made of an organic material, and an opposite electrode (cathode). Many of the organic EL elements further have an electron injection layer, a hole injection layer and so on, in order to improve luminescent property, and have a structure wherein these are deposited into a lamination on a substrate. This is a principle that luminescence is caused by recombination in the luminous layer of an electron injected from the cathode to the luminous layer with a hole injected from the anode to the luminous layer.

For elements having a structure wherein thin film layers are deposited into a lamination, such as organic EL elements as described above, the respective layers are deposited by vacuum evaporation in many cases.

However, if thin film layers are deposited into a lamination on a substrate having a large screen by this vacuum evaporation, a problem that homogeneous films cannot be formed arises. Therefore, many substrate pieces cannot be arranged in a substrate of a large area so that mass production is not allowed. If a large-sized device is produced, luminescence variation is generated in the luminous plane thereof so that the device becomes a defective product.

Against such problems, JP-A-10-335062 suggests a method in which the relationship between the deposition position, on a substrate, of a material, and the vapor density thereof is represented by a function of $\cos^n\theta$, the n value thereof is set to 3 to 6, and an evaporation source thereof is set to a position apart from the center of the substrate. By this method, however, it is difficult to form a homogenous thin film on a substrate having a large screen. Thus, the variation of luminescence performance cannot be overcome just yet. Accordingly, the following points are unsolved problems from the viewpoint that in an organic EL element or the like element which has a structure wherein thin film layers are deposited into a lamination on a substrate having a large screen, the homogeneity of luminescence performance at respective positions in the element is kept.

(1) In the case that thin films are deposited into a lamination, change in the film thickness of each of the films is large at respective positions on a deposition substrate. Thus, in the case of an organic EL element, the variation of luminescence performance is generated inside the plane of the element.

(2) In the case that, for an organic EL element or the like element, a host material and a dopant material of its luminous layer are co-evaporated as evaporation sources, the density of the dopant is not constant in the plane of the element so that the variation of luminescence performance is generated.

The present invention has been made from the above-mentioned viewpoints. An object of the present invention is to provide a method for depositing a homogeneous thin film layer for an element, even on a deposition substrate having a large screen, by vacuum evaporation, the method being capable of attaining the following. In the case of depositing many layers into a lamination, change in the film thickness of each of the films can be made small at respective positions on a deposition substrate. In the case of co-evaporating plural evaporation sources, change in the density of each of the materials can be made small at respective positions on a deposition substrate.

Another object of the present invention is to provide an organic EL element which is produced by such a method for depositing a thin film layer for an element, and which is small in the variation of luminescence performance at respective positions in the element.

DISCLOSURE OF THE INVENTION

In order to attain the above-mentioned objects, the inventors made eager investigations. As a result, the inventors have found out that in the case plural materials are deposited into films by vacuum evaporation, the uniformity of the film thicknesses can be made very high if the relationship between the position of the material i to be deposited on a deposition substrate and the film thickness of the deposited film is represented by $\cos^{ni}\theta$ and the ni value of each of the materials is controlled within a specified range. On the basis of such a finding, the present invention has been made. Therefore, the subject matters of the present invention are as follows.

(1) A method for an element of forming one or more thin films on a substrate by depositing two or more materials by vacuum evaporation, comprising, depositing each material under such control that ni value of the each material is k±0.5 wherein k is a constant from 2 to 5, when relationship between a deposition position and a film thickness of a material i on the substrate is approximated by the following expression (1):

$$D_i/D_{0i} \propto (L_0/L_i)^3 \cos^{ni}\theta_i \qquad (1)$$

wherein $L_0$ is a distance from an evaporation source to a plane of the substrate in a perpendicular direction, $D_{0i}$ is a film thickness of the material i at an intersection point of a perpendicular line from the evaporation source to the plane of the substrate, and $D_i$ is a film thickness of the material i at a position on the substrate which is apart from the evaporation source by a distance $L_i$ in a direction of an angle $\theta_i$ against the perpendicular line.

(2) The method according to item (1), wherein k is 2 to 3.

(3) The method according to item (1), wherein k is 2.

(4) The method according to any one of items (1) to (3), wherein the ni value is controlled by (a) a method of adjusting a shape of a crucible for holding the evaporation source and/or (b) a method of adjusting evaporation rate.

(5) The method according to any one of items (1) to (4), wherein two or more materials are successively deposited to form a lamination of thin film layers.

(6) The method according to any one of items (1) to (4), wherein two or more materials are simultaneously deposited to form one film.

(7) The method according to any one of items (1) to (6), wherein a material is deposited by an eccentric rotation evaporation method.

(8) The method according to any one of items (1) to (7), wherein the materials are organic materials for organic layers of an organic electroluminescence element and the layers are formed by using the materials.

(9) The method according to item (6), wherein the materials are a host material and a dopant material of a luminous layer of an organic electroluminescence element, and the luminous layer is formed by co-depositing the host and dopant materials.

(10) An organic electroluminescence element comprising organic layers formed by the method according to item (8).

(11) The organic electroluminescence element comprising a luminous layer formed by the method according to item (9).

(12) The organic electroluminescence element according to items (10) or (11), wherein variation of X coordinate of CIE luminescence chromaticity is 0.005/250 mm or less and variation of Y coordinate thereof is 0.02/250 mm or less.

(13) The organic electroluminescence element according to any one of items (10) to (12), wherein variation of electric power conversion efficiency is 15%/250 mm or less.

BEST MODE FOR CARRYING OUT THE INVENTION

Embodiments of the present invention will be described hereinafter.

The present invention is a method for an element of forming one or more thin films on a substrate by depositing two or more materials by vacuum evaporation, comprising, depositing each material under such control that ni value of the each material is k±0.5 wherein k is a constant from 2 to 5, when relationship between a deposition position and a film thickness of a material i on the substrate is approximated by the following expression (1):

$$D_i/D_{0i} \propto (L_0/L_i)^3 \cos^{n_i}\theta_i \quad (1)$$

wherein $L_0$ is a distance from an evaporation source to a plane of the substrate in a perpendicular direction, $D_{0i}$ is a film thickness of the material i at an intersection point of a perpendicular line from the evaporation source to the plane of the substrate, and $D_i$ is a film thickness of the material i at a position on the substrate which is apart from the evaporation source by a distance $L_i$ in a direction of an angle $\theta_i$ against the perpendicular line.

On the assumption that any evaporation source is a point evaporation source in vacuum evaporation, the side of the cosine in the expression (1) is true. The respective symbols in this expression are as described above. The ni value is a positive value representing the spread of particles of vapor from the evaporation source, and is originally different dependently on materials and a value peculiar to each thereof. For example, about metals such as Al, their ni value is large and is generally from 6 to 10 or more. On the other hand, about organic materials, their ni value is smaller than about the metals. When this ni value is large, the spread of the vapor particles is small and tends to have a local distribution. When the ni value is small, the spread tends to have a diffusive distribution.

Therefore, in the case that a single material is deposited into a film, the ni value thereof is generally set to a value of about 2 to about 6, and is preferably set to a value of 2 to 4. The present invention is a method of controlling such ni value and adjusting the ni value of each of materials within the range of k±0.5 wherein k is a constant of 2 to 5 to carry out vacuum evaporation. To make the homogeneity of films higher and suppress loss of the materials by diffusion, the constant k is more preferably 2 to 3. About 2 is particularly preferred. If this value is about 2, films having high homogeneity can be formed even if an eccentric rotation evaporation method, which will be described later, is not used.

In the present invention, examples of the method for controlling the ni value include the following methods (a) and (b).

(a) Method of Adjusting the Shape of Crucible

This is a method of adjusting the shape of a crucible, which is a member in which the materials are received. The element for adjusting this is, for example, the diameter (h) of the opening of the crucible, the thickness (t) of the opening, the depth (d) thereof, or the like. By adjusting them, the ni value is adjusted. The ni value becomes small, for example, if d/t is made large. The ni value also becomes small, for example, if the depth h of the crucible is made small. In short, the value ni value can be adjusted to a desired value, for example, if d/t and h are changed.

Usually, the used crucible may be a product formed into a substantially cylindrical form and made of quartz, graphite, glassy carbon, BN (boron nitride), alumina or the like.

(b) Method of Changing Evaporation Rates

This is a method of increasing or decreasing the evaporation rate to adjust the ni value. If the evaporation rate is made large, the ni value becomes small and deposition particles behave to have a more dispersible extent. Since the evaporation rate varies dependently on the temperature of the crucible, the ni value is usually adjusted by raising or falling the crucible temperature.

As such a method for controlling the ni value, either one of the method (a) or the method (b) may be used, or a combination of two or more methods thereof may be used.

Accordingly, the object of the present invention can be attained by combining the ni value peculiar to the material with one or more of the above-mentioned methods for adjusting the ni value and controlling the ni value of each of the materials at the time of film-forming within the given range (k±0.5). In other words, in the case that plural thin films are formed by controlling the ni values of the plural materials into substantially the same value and successively evaporating the materials as described above, the film thickness of each of the films is homogenous at respective positions on the deposition substrate. In the case that plural materials are simultaneously co-evaporated to form a co-deposition film, the formed thin film can be made to have a small change in the density of each of the materials over the entire surface of the deposition substrate.

It becomes necessary to co-evaporate plural materials simultaneously to form a co-deposition film and further adjust the density of each of the materials. It is preferred to perform this method by arranging the so-called chopper mechanism between evaporation sources and a deposition substrate and near the evaporation sources. In other words, it is advisable that this method is performed by adjusting the ni value through the above-mentioned method (a) or (b), and adjusting the amount of vapor reaching a deposition substrate into a small value while keeping the ni value. Specific examples of the chopper mechanism include a mechanism in which the upper of a cylinder has an arc-form opening and the opening is opened or shut at regular intervals by the rotation thereof.

Figure 1:
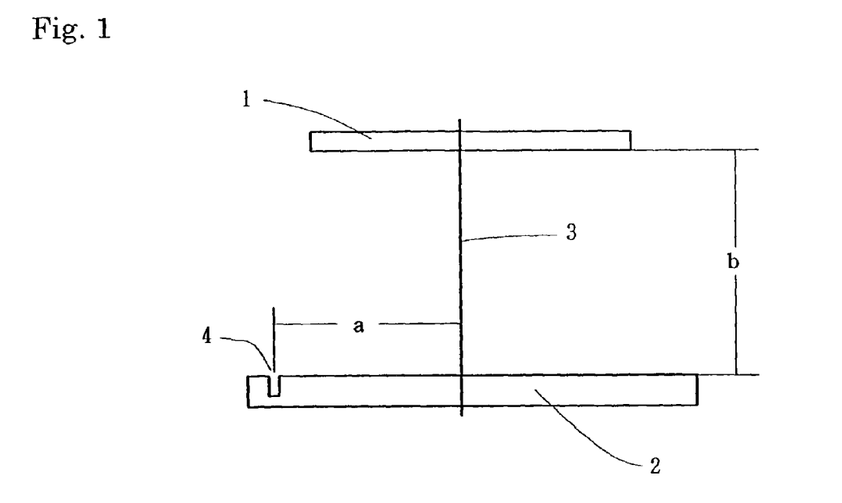
FIG. 1 is a schematic view of a method for depositing a film by an eccentric rotation evaporation method which is related to one embodiment of the present invention.

The method for depositing a thin film layer for an element of the present invention may be any method if the above-mentioned conditions can be satisfied. For example, the method may be a method in which a deposition substrate is fixed without being rotated and an evaporation source is arranged below the center thereof (non-rotation evaporation method), a method in which the above-mentioned deposition substrate is rotated, or the so-called eccentric rotation evaporation method in which a deposition substrate is rotated and an evaporation source is positioned apart from the center of the rotation of the deposition substrate. This eccentric rotation evaporation method is a method effective particularly for cases in which the area of the deposition substrate is large. A specific example of this eccentric rotation evaporation method can be conceptually illustrated, for example, by FIG. 1. In FIG. 1, 1 represents a deposition substrate; 2, an evaporation source holder; 3, a rotation axis of the deposition substrate; and 4, an evaporation source. The deposition substrate 1 is rotated around the deposition substrate rotation axis 3, as the center, and further the evaporation source 4 is arranged apart from the deposition substrate rotation axis (center). In this method, a film is in general deposited under conditions that the size of a long side of the deposition substrate is 20 to 80 cm, the distance b between the evaporation source holder and the deposition substrate is 20 to 100 cm, and the eccentric distance a of the evaporation source is 10 to 40 cm. The rotation rate is usually 2 to 10 rpm.

Next, the above-mentioned method for depositing a thin film layer for an element can be used for functional elements or the like elements comprising, for example, a solar battery, a photoconductive material, or an organic material, and is a method which is particularly effective for the production of organic EL elements. Hereinafter, a method for depositing a thin film layer in the production of an organic EL element will be described. Namely, the present invention is the above-mentioned method for depositing a thin film layer for an element, wherein the materials are organic materials for organic layers of an organic electroluminescence element and the layers are formed by using the materials.

This method makes it possible to obtain organic layers of an organic EL element in which change in the film thickness of each of the films is small at respective positions in the element. As a result, the variation of luminescence performance at respective positions of the organic EL element is not generated and uniform luminescence performance can be exhibited even if the element is an element having a large area.

The present invention is also the above-mentioned method for depositing a thin film layer for an element, wherein the materials are a host material and a dopant material of a luminous layer of an organic electroluminescence element, and the luminous layer is formed by co-depositing the host and dopant materials. In the film-deposition, it is advisable that the density of the dopant is adjusted by arranging the above-mentioned chopper mechanism.

Such a film-depositing method has advantages that the film thickness of the luminous layer can be made uniform and the dopant density in the luminous layer can be made uniform. Therefore, the variation of luminescence performance of the organic EL element is not generated and more uniform luminescence performance can be exhibited even if the element is an element having a large area.

Organic layers including the luminous layer of the organic EL element will be specifically described.

As the organic EL element used in the present invention, there is usually used an organic EL element which has at least a recombination area and a luminous area, as organic layers, on an anode made of a transparent electrode. The recombination area and the luminous area are usually present in the luminous layer. Therefore, only the luminous layer may be used as an organic layer. Besides the luminous layer, however, a hole injection layer, an electron injection layer, an organic semiconductor layer and the like can be used if necessary. A cathode is formed on these organic layers.

Typical constituent examples of the organic EL element used in the present invention are shown. Of course, the present invention is not limited to these examples.

Structures as follows can be given:

(1) transparent electrode (anode)/luminous layer/electrode (cathode), (2) transparent electrode (anode)/hole injection layer/luminous layer/electrode (cathode), (3) transparent electrode (anode)/luminous layer/electron injection layer/electrode (cathode), (4) transparent electrode (anode)/hole injection layer/luminous layer/electron injection layer/electrode (cathode)

(5) anode/organic semiconductor layer/luminous layer/cathode (6) anode/organic semiconductor layer/electron barrier layer/luminous layer/cathode, and

(7) anode/hole injection layer/luminous layer/adhesion improving layer/cathode. Among these, the structure (4) is preferably used. Besides these, luminescence may be from the side of the cathode, that is, the cathode may be made of a transparent electrode. Alternatively, luminescence may be taken from both sides of the anode and the cathode.

[Evaporation Materials of the Organic Layer of the Organic EL Element]

① Evaporation Materials of the Luminous Layer

As the evaporation material (host material) constituting the luminous layer of the organic EL element, a distyrylarylene compound represented by the following general formula (I) is preferably used:

This compound is disclosed in JP-A-2-247278.

In the general formula, $Y^1$ to $Y^4$ each independently represents a hydrogen atom, an alkyl radical having 1 to 6 carbon atoms, an alkoxy radical having 1 to 6 carbon atoms, an aralkyl radical having 7 to 8 carbon atoms, a substituted or nonsubstituted aryl radical having 6 to 18 carbon atoms, a substituted or nonsubstituted cyclohexyl radical, a substituted or nonsubstituted aryloxy radical having 6 to 18 carbon atoms, or an alkoxy radical having 1 to 6 carbon atoms. The substituent herein is an alkyl radical having 1 to 6 carbon atoms, an alkoxy radical having 1 to 6 carbon atoms, an aralkyl radical having 7 to 8 carbon atoms, an aryloxy radical having 6 to 18 carbon atoms, an acyl radical having 1 to 6 carbon atoms, an acyloxy radical having 1 to 6 carbon atoms, a carboxyl radical, a styryl radical, an arylcarbonyl radical having 6 to 20 carbon atoms, an aryloxycarbonyl radical having 6 to 20 carbon atoms, an alkoxycarbonyl radical having 1 to 6 carbon atoms, a vinyl radical, an anilinocarbonyl radical, a carbamoyl radical, a phenyl radical, a nitro radical, a hydroxyl radical, or a halogen. The substituents may be alone or in combination. $Y^1$ to $Y^4$ may be the same or different. $Y^1$ and $Y^2$ may be bonded to each other, and $Y^3$ and $Y^4$ may be bonded to each other to form a substituted or nonsubstituted saturated 5-membered ring or a substituted or nonsubstituted saturated 6-memebred ring. Ar represents a substituted or nonsubstituted arylene radical having 6–40 carbon atoms, and may be substituted at a single position or plural positions. Its bonding moieties may be ortho, para, or meta. However, in the case that Ar is a non-substituted phenylene radical, $Y^1$ to $Y^4$ each independently represents any one selected from an alkoxy radical having 1 to 6 carbon atoms, an aralkyl radical having 7 to 8 carbon atoms, a substituted or nonsubstituted naphthyl radical, a biphenyl radical, a cyclohexyl radical, and an aryloxy radical. As examples of such distyrylarylene compounds, the following can be given.

-continued

As the evaporation material (host material) constituting another preferred luminous layer, a metal complex of 8-hydroxyquinoline or a derivative thereof can be given. Specific examples thereof include metal chelate oxanoid compounds including chelates of oxine (generally, 8-quinolinol or 8-hydroxyquinoline). Such compounds exhibit high level performance, and are easily fashioned into a thin film form. Examples of the oxanoid compound satisfy the following structural formula.

wherein Mt represents a metal, n is an integer of 1 to 3, and the positions of Z's are each independently and Z is atoms necessary for completing at least two condensed aromatic rings.

The metal represented by Mt may be monovalent, bivalent or trivalent metals. Examples thereof include alkali metals such as lithium, sodium and potassium; alkali earth metals such as magnesium and calcium; and earth metals such as boron and aluminum. It is allowable to use all of monovalent, bivalent and trivalent metals which are generally known as useful chelate compounds.

Z represents atoms which make a heteroring wherein one of at least two condensed aromatic rings is azole or azine. If necessary, some other ring may be added to the condensed aromatic ring. In order to avoid a bulky molecule without improving functions, the number of the atoms represented by Z is preferably 18 or less. Specific examples of the chelated oxanoid compound include tris(8-quinolinol)aluminum, bis(8-quinolinol)magnesium, bis(benzo-8-quinolinol)zinc, bis(2-methyl-8-quinolinolate)aluminum oxide, tris (8-quinolinol)indium, tris(5-methyl-8-quinolinol) aluminum, 8-quinolinollithium, tris(5-chloro-8-quinolinol) gallium, bis(5-chloro-8-quinolinol)calcium, 5,7-dichloro-8-quinolinol aluminum, and tris(5,7-dibromo-8-hydroxyquinolinol)aluminum.

A metal complex of phenolate-substituted 8-hydroxyquinoline which is described in JP-A-5-198378 is preferred as a blue luminescent material. Specific examples of this metal complex of phenolate-substituted 8-hydroxyquinoline include bis(2-methyl-8-quinolinolate)(phenolate)aluminum (III), bis(2-methyl-8-quinolinolate)(o-cresolate)aluminum (III), bis(2-methyl-8-quinolinolate)(m-cresolate)aluminum (III), bis(2-methyl-8-quinolinolate)(p-cresolate)aluminum (III), bis(2-methyl-8-quinolinolate(o-phenylphenolate)aluminum (III), bis(2-methyl-8-quinolinolate)(m-phenylphenolate)aluminum (III), bis(2-methyl-8-quinolinolate)(p-phenylphenolate)aluminum (III), bis(2-methyl-8-quinolinolate) (2,3-dimethylphenolate)aluminum (III), bis(2-methyl-8-quinolinolate)(2,6-dimethylphenolate)aluminum (III), bis(2-methyl-8-quinolinolate)(3,4-dimethylphenolate)aluminum (III), bis(2-methyl-8-quinolinolate)(3,5-dimethylphenolate) aluminum (III), bis(2-methyl-8-quinolinolate)(3,5-di-t-butylphenolate)aluminum (III), bis(2-methyl-8-quinolinolate) (2,6-diphenylphenolate)aluminum (III), and bis(2-methyl-8-quinolinolate)(2,4,6-triphenylphenolate)aluminum (III). These luminescent materials may be used alone or in combination of two or more.

The following is more specific description. For example, in the case that two luminous layers are formed, various known luminescent materials may be used for the first luminous layer. A preferred example of the first luminous layer may be a layer wherein a small amount, that is, 0.2 to 3% by weight of a green fluorescent dye is added to the oxanoid compound. The green luminescent dye added herein is a coumalin type or a quinacridone type. By adding this, the element having the first luminous layer makes it possible to realize green luminescence having a high efficiency of 5 to 20 (lm/w). When it is desired that yellow or orange color is taken out with a high efficiency from the first luminous layer, there is used a layer wherein 0.2 to 3% by weight of rubrene, a derivative thereof, a dicyanopyran derivative or a perylene derivative is added to the oxanoid compound. Such an element can output luminescence with a high efficiency of 3 to 10 (lm/w). By adding a green fluorescent dye and a red fluorescent dye simultaneously, orange color can be realized. Preferably, for example, coumalin and a dicyanopyran type dye, quinacridon and a perylene dye, or coumalin and a perylene dye may be simultaneously used. Another particularly preferred example of the first luminous layer is a polyarylene vinylene derivative. This makes it possible to output green or orange very efficiently. For the second luminous layer, various known blue luminescent materials may be used. For example, a distyrylarylene derivative, a trisstyrylarylene derivative, and an allyl-oxidized quinolilate metal complex are high level blue luminescent material. As a polymer, a polyparaphenylene derivative can be given.

The film thickness of the luminous layer is not particularly limited. The film thickness is preferably within the range of 1 nm to 10 μm, particularly preferably with the range of 5 nm to 0.5 μm.

② Evaporation Materials of the Hole Injection Layer

The hole injection layer is not necessarily essential for the element used in the element, but is preferably used for improving luminescence performance. This hole injection layer is a layer for assisting the injection of holes into the luminous layer. Its hole mobility is large, and its ionizing energy is usually as small as 5.5 eV or less. Such a hole injection layer is preferably made of a material for transporting holes into the luminous layer at a lower electric field. More preferably, the mobility of holes is at least about $10^{-6}$ cm$^2$/V·second, for example, when an electric field of $10^4$ to $10^6$ V/cm is applied. The evaporation material constituting such a hole injection layer of the organic EL element is not particularly limited if the material has the above-mentioned preferred properties. It is possible to use any one selected from materials which have been conventionally used as materials for transporting charge and hole in photoconductive materials, and known materials used in hole injection layers of EL elements. Specific examples thereof include triazole derivatives (see U.S. Pat. No. 3,112,197), oxadiazole derivatives (see U.S. Pat. No. 3,189,447), imidazole derivatives (see JP-B-37-16096), polyarylalkane derivatives (U.S. Pat. Nos. 3,615,402, 3,820,989 and 3,542,544, JP-B-45-555, JP-B-51-10983, JP-A-51-93224, JP-A-55-17105, JP-A-56-4148, JP-A-55-108667, JP-A-55-156953, and JP-A-56-36656), pyrazoline derivatives and pyrazolone derivatives (see U.S. Pat. Nos. 3,180,729 and 4,278,746, JP-A-55-88064, JP-A-55-88065, JP-A-49-105537, JP-A-55-51086, JP-A-56-80051, JP-A-56-88141, JP-A-57-45545, JP-A-54-112637, and JP-A-55-74546), phenylenediamine derivatives (see U.S. Pat. No. 3,615,404, JP-B-51 to 10105, JP-B-46-3712, JP-B- 47-25336, JP-A-54-53435, JP-A-54-110536, and JP-A-54-119925), arylamine derivatives (see U.S. Pat. Nos. 3,567,450, 3,180,703, 3,240,597, 3,658,520, 4,232,103, 4,175,961 and 4,012,376, JP-B-49-35702, JP-B-39-27577, JP-A-55-144250, JP-A-56-119132, JP-A-56-22437, and West German Patent No. 1,110,518), amino-substituted chalcone derivatives (see U.S. Pat. No. 3,526, 501), oxazole derivatives (derivatives disclosed in U.S. Pat. No. 3,257,203), fluorenone derivatives (see JP-A-54-110837), hydrazone derivatives (see U.S. Pat. No. 3,717, 462, JP-A-54-59143, JP-A-55-52063, JP-A-55-52064, JP-A-55-46760, JP-A-55-85495, JP-A-57-11350, JP-A-57-148749, and JP-A-2-311591), styrylanthracene derivatives (see JP-A-56-46234), stilbene derivatives (JP-A-61-210363, JP-A-61-228451, JP-A-61-14642, JP-A-61-72255, JP-A-62-47646, JP-A-62-36674, JP-A-62-10652, JP-A-62-30255, JP-A-60-93445, JP-A-60-94462, JP-A-60-174749, and JP-A-60-175052), silazane derivatives (U.S. Pat. No. 4,950, 950), polysilane derivatives (JP-A-2-204996), aniline type copolymers (JP-A-2-282263), and electroconductive polymer oligomers (particularly, thiophene oligomer) disclosed in JP-A-1-211399. As the materials of the hole injection layer, the above-mentioned may be used, but the use of the following is preferred: porphyrin compounds (compounds disclosed in JP-A-63-29569), and aromatic tertiary amine compounds and styrylamine compounds (see U.S. Pat. No. 4,127,412, JP-A-53-27033, JP-A-54-58445, JP-A-54-149634, JP-A-54-64299, JP-A-55-79450, JP-A-55-144250, JP-A-56-119132, JP-A-61-295558, JP-A-61-98353, and JP-A-63-295695), particularly aromatic tertiary amine compounds. Representative examples of the porphyrin compounds include porphyrin, 1,10,15,20-tetraphenyl-21H, 23H-porphirin copper (II), 1,10,15,20-tetraphenyl-21H, 23H-porphirin zinc (II), 5,10,15,20-tetrakis (pentafluorophenyl)-21H,23H-porphirin, silicon phthalocyanine oxide, aluminum phthalocyanine chloride, phthalocyanine (non-metal), dilithium phthalocyanine, copper tetramethylphthalocyanine, copper phthalocyanine, chromium phthalocyanine, zinc phthalocyanine, lead phthalocyanine, titanium phthalocyanine oxide, Mg phthalocya- nine, and copper octamethylphthalocyanine. Representative examples of the aromatic tertiary amine compounds and the styrylamine compounds include N,N,N',N'-tetraphenyl-4,4'-diaminophenyl, N,N'-diphenyl-N,N'-bis-(3-methylphenyl)-[1,1'-biphenyl]-4,4'-diamine (abbreviated to TPD hereinafter), 2,2-bis(4-di-p-tolylaminophenyl)propane, 1,1-bis(4-di-p-tolylaminophenyl)cyclohexane, N,N,N',N'-tetra-p-tolyl-4,4'-diaminophenyl, 1,1-bis(4-di-p-tolylaminophenyl)-4-phenylcyclohexane, bis(4-dimethylamino-2-methylphenyl) phenylmethane, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminophenylether, 4,4'-bis(diphenylamino)quadriphenyl, N,N,N-tri(p-tolyl)amine, 4-(di-p-tolylamino)-4'-[4(di-p-tolylamino)styryl]stylbene, 4-N,N-diphenylamino-(2-diphenylvinyl)benzene, 3-methoxy-4'-N,N-diphenylaminostylbenzene, N-phenylcarbazole, 4,4'-bis[N-(1-naphthyl)-N-phenylamino]biphenyl (abbreviated to NPD hereinafter), which has in the molecule thereof two condensed aromatic rings and is disclosed in U.S. Pat. No. 5,061,569, and 4,4',4''-tris[N-(3-methylphenyl)-N-phenylamino] triphenylamine (abbreviated to MTDATA hereinafter), which has three triphenylamine units connected in a star burst form and is disclosed in JP-A-4-308688. Besides the above-mentioned aromatic dimethylidene type compounds given as the materials of the luminous layer, inorganic compounds such as p-type Si and p-type SiC can be used as the material of the hole injection layer. The hole injection layer can be formed by making the above-mentioned compound into a thin film by vacuum evaporation. The film thickness of the hole injection layer is not particularly limited, and is usually from 5 nm to 5 μm. This hole injection layer may be a monolayer made of one or more of the above-mentioned materials, or may be a lamination in which a hole injection layer made of a compound different from that of the above-mentioned hole injection layer is deposited. The organic semiconductor layer is a layer for assisting the injection of holes or electrons into the luminous layer, and suitably has an electroconductivity of $10^{-10}$ S/cm or more. As the material of such an organic semiconductor layer, electroconductive oligomers such as thiophene-containing oligomers, and arylamine-containing oligomers, and electroconductive dendrimers such as arylamine-containing dendrimers.

③ Evaporation Materials of the Electron Injection Layer

On the other hand, the electron injection layer is a layer for assisting the injection of electrons into the luminous layer, and its electron mobility is large. The adhesion improving layer is a layer made of a material which is good in the adhesion to the cathode, among the electron injection layers. Preferred examples of the evaporation material constituting such an electron injection layer of the organic EL element are metal complexes of 8-hydroxyquinoline or derivatives thereof, or oxadiazole derivatives. As the material used in the adhesion improving layer, metal complexes of 8-hydroxyquinoline or derivatives thereof are particularly suitable. Specific examples of metal complexes of 8-hydroxyquinoline or derivatives thereof include metal chelate oxanoid compounds, including chelates of oxine (generally, 8-quinolinol or 8-hydroxyquinoline). On the other hand, examples of the oxadiazole derivatives are electron-conducting compounds represented by the general formulae (II), (III) and (IV):

(II)

(III)

(IV)

wherein $Ar^{10}$ to $Ar^{13}$ each independently represents a substituted or nonsubstituted aryl radical, and $Ar^{10}$ and $Ar^{11}$ may be the same or different, and $Ar^{12}$ and $Ar^{13}$ may be the same or different. $Ar^{14}$ represents a substituted or nonsubstituted arylene radical. Examples of the aryl radical include phenyl, biphenyl, anthranyl, perylenyl and pyrenyl radicals. Examples of the arylene radical include phenylene, naphthylene, biphenylene, anthracenylene, perylenylene and pyrenylene radicals. Examples of the substituent include alkyl radicals having 1 to 10 carbon atoms, alkoxy radicals having 1 to 10 carbon atoms and a cyano radical. As this electron-conducting compound, a thin-film forming compound is preferred. Specific examples of the electron-conducting compound include:

(PBD)

-continued

④ Other Organic Evaporation Materials

The organic layer has such a structure as above, but may further have an electron barrier layer, an adhesion improving layer, or the like. However, these have a relatively small effect on the uniformity of luminescence. Therefore, the method for forming the layers is not limited, and may be the method of the present invention or some other known method.

The evaporation material of the electron barrier layer may be the above-mentioned TPD, a polyphenyl compound, or the like, and the evaporation material of the adhesion improving material may be Alq (a metal complex of 8-hydroquinoline), which was described as an electron-injecting material, or the like.

[Evaporation Materials of Others than the Organic Layer in the Organic EL Element]

To form these layers, the method for depositing a thin film layer for an element of the present invention may be used, but this method may be not necessarily used. Different film-depositing methods may be used as described in respective descriptions.

① Evaporation Materials of the Transparent Electrode (Anode)

As the anode, ITO, which has a large work function (4 eV or more), can be given. The anode can be formed by forming a thin film by sputtering, ion-plating, electron beam evaporation, CVD, MOCVD, plasma CVD or the like method. In the case that luminescence from the luminous layer is taken out from the anode in this way, it is preferred to set a luminescence-transmissivity of the anode to more than 10%. The sheet resistivity of the anode is preferably several hundreds $\Omega/\square$ or less. The film thickness of the anode, which depends on the material thereof, is usually from 10 nm to 1 $\mu$m, and is preferably from 10 to 200 nm. In the present invention, a substrate electrode is usually used as the anode.

② Evaporation Materials of the Electrode (Cathode)

As the cathode, a cathode whose electrode material is a metal, an alloy, an electroconductive compound, or a mixture thereof having a smaller work function (4.0 eV or less) is used. Specific examples of evaporation material of such an electrode material include sodium, sodium-potassium alloy, magnesium, lithium, magnesium-silver alloy, aluminum/aluminum oxide ($Al_2O_3$), aluminum-lithium alloy, indium, and rare earth metals. This cathode can be produced by depositing the electrode material into a thin film in the same way as for forming a film of the transparent electrode, such as evaporation or sputtering. The sheet resistivity of the cathode is preferably several hundreds $\Omega/\square$ or less, and the film thickness thereof is usually from 10 nm to 1 $\mu$m, preferably from 50 to 200 nm. In the organic EL element used in the present invention, it is preferred that either of the anode or the cathode is transparent or semitransparent since the efficiency of taking out luminescence is good because of transmission of the luminescence.

[Other Parts of the Organic EL Element]

The support substrate used in the present invention is preferably made of a material having transparency and a rigidity sufficient to support a multicolor luminescence device. In the present invention, the multicolor luminescence device is reinforced by arranging the support substrate, so as to make mechanical strengths such as shock resistance high.

Specific examples of the material include a glass plate, a ceramic plate, and a plastic plate (polycarbonate resin, acrylic resin, vinyl chloride resin, polyethylene terephthalate resin, polyimide resin, polyester resin and so on).

The method for depositing a thin film for an element of the present invention is as described above. The organic EL element having the luminous layer or the organic layers formed by these methods has performance described as follows: the respective film thicknesses of the organic layers are highly uniform so that the uniformity of the luminescence performance of the element becomes high.

This uniformity of the luminescence performance can be checked, for example, on the assumption that non-luminescence points are not present, through the variation of luminescence chromaticity depending on the distance from the center of the deposition substrate, the variation of electric power conversion efficiency depending on the distance from the center of the deposition substrate, or the like. The variation of luminescence chromaticity depending on the distance from the center of the deposition substrate in the present invention is as follows: a variation of 0.005/250 mm or less, particularly 0.002/250 mm or less can be obtained about the X coordinate of CIE luminescence chromaticity; and a variation of 0.02/250 mm or less, particularly 0.01/250 mm or less can be obtained about the Y coordinate thereof. About the variation of the electric power conversion efficiency, a variation of 15%/250 mm or less can be obtained.

Therefore, in the case of an element having a large screen, it is possible to obtain an element having the following properties about the variation of the luminescence performances in the same element: an element having a variation of 0.005/250 mm or less about the X coordinate of the CIE luminescence chromaticity, a variation of 0.02/250 mm or less about the Y coordinate thereof, and a variation of 15%/250 mm or less about the electric power conversion efficiency.

EXAMPLES

The present invention will be more specifically described by way of Examples, but is not limited by these Examples.

Experiment Example 1

(Example Wherein the ni Value was Measured)

There was used a vacuum evaporation machine wherein an evaporation source was set at a position which had a perpendicular distance of 500 mm between a deposition substrate (size: 360×465 mm) and an evaporation source holder, and was 250 mm apart from the intersection point of the evaporation source holder and a perpendicular line extended downwards from the center of the deposition substrate to the evaporation source holder. In the evaporation source, 1.5 g of a material, tris(8-quinolinol)aluminum (abbreviated to Alq hereinafter) was uniformly filled into the bottom of a graphite crucible having an opening diameter of 25 mm, a thickness of 1.6 mm, and a depth of 70 mm. The temperature of the crucible was set to 283° C. (so that the evaporation rate at the center of the substrate would be 1.0 Å/s). The evaporation was performed until the thickness of the resultant film at the center of the substrate was 2500 Å. The film thicknesses at 50 points inside the area of the deposition substrate were measured by means of a pin-contacting type thickness tester Dektak FPD500. The respective film thicknesses were fitted so as to be obedient to the equation (I), and then the ni value was calculated. The ni value in the present film-deposition was 2.38.

Experiment Examples 2 to 5

(Examples Wherein Evaporation Rate and the ni Value Were Adjusted)

In the same way as in Example 1, 4,4'-bis[N-(1-naphthyl)-N-phenylamino]biphenyl (abbreviated to NPD hereinafter, in Experiment Example 2), 4,4',4"-tris[N-(3-methylphenyl-N-phenylamino]triphenylamine (abbreviated to MTDATA hereinafter, in Experiment Example 3), 4,4'-bis[2-[4-(N,N-di-p-tolyl)phenyl]vinyl]biphenyl (abbreviated to DTAVBi hereinafter, in Experiment Example 4), and 4,4'-bis(2,2-diphenylvinyl)biphenyl (abbreviated to DPVBi hereinafter, in Experiment Example 5) were evaporated until the thickness of each resultant film was 2500 Å at the center of the substrate. The temperature of the crucible was set to 258, 260, 287 or 230° C. and each evaporation rate was set to 1.0 Å/s, to perform the evaporation. Each ni value is as shown in Table 1.

TABLE 1

| Experiment Example | Evaporation Temperature ° C. | ni value |
|---|---|---|
| 2 | 258 | 3.40 |
| 3 | 260 | 3.52 |
| 4 | 287 | 2.44 |
| 5 | 230 | 2.35 |

Experiment Example 6

(Example Wherein the ni Value was Adjusted by the Shape of a Crucible)

The following crucibles A and B having difference depths were set up, at a position which had a perpendicular distance of 400 mm between a deposition substrate (size: 210×260 mm) and an evaporation source holder and was 100 mm apart from the intersection point of the evaporation source holder and a perpendicular line extended downwards from the center of the deposition substrate to the evaporation source holder, in such a manner that the crucibles were inclined at an angle of 15° to a perpendicular line to the plane of the deposition substrate. DTAVBi was filled, as a material, into each of the crucibles to perform evaporation under the following conditions. Next, the film thicknesses at 9 points inside the deposition substrate were measured by means of the pin-contacting type thickness tester Dektak FPD500, and then the ni value was calculated.

Evaporation Conditions:
  shape of the crucibles:
    A made by quartz, inside diameter: 20 mm φ, depth: 75 mm
    B made by quarts, inside diameter: 20 mm φ, depth: 37.5 mm
  evaporation rate:
    The temperatures of the crucibles A and B were set to 283 and 293° C., respectively, and each evaporation rate was set to 0.15 Å/s at the center of the deposition substrate.
  ni value:
    crucible A: 2.85
    crucible B: 5.85

Experiment Example 7

(Example Wherein the ni Value was Adjusted by Evaporation Rate)

Evaporation was performed and the ni value was measured in the same way as in Experiment Example 1 (Experiment Example 4) except that DTAVBi was evaporated at an evaporation rate of 0.05 Å/s. At this time, evaporation temperature was 275° C. and the ni value was 6.28.

Example 1

(Formation of a Film of an Organic EL Element While the ni Value was Controlled, and Evaluation I of Luminescence Performance of the Resultant Element: Eccentric Rotation Evaporation Method)

(1) Formation of a Film of an Organic EL Element While the ni Value was Controlled There was used a vacuum evaporation machine wherein an evaporation source was set at a position which had a perpendicular distance of 500 mm between a deposition substrate and an evaporation source holder and was 250 mm apart from the intersection point of the evaporation source holder and a perpendicular line extended downwards from the center of the deposition substrate to the evaporation source holder. The rotation number of the deposition substrate was set to 4.8 rpm, and then the following deposition into a film was performed by an eccentric rotation evaporation method. A crucible made of graphite and having an opening diameter of 25 mm, a thickness of 1.6 mm and a depth of 70 mm was used. Twenty five (5×5) glass substrates (25×25×1.1 mm), each of which had on its surface deposited ITO which was an anode and had a thickness of 120 nm, were set to a substrate holder having a size of 390×490 mm, and the holder was loaded on the vacuum evaporation machine. Evacuation was performed until the degree of vacuum was be 2×10$^{-4}$ Pa or less. Five materials for organic layers of an organic EL element and a material for an electrode, which was composed of an inorganic layer, were arranged into a concentric form in the crucible. While evaporation rate was changed, the ni value in each film-formation was controlled to form films a to e as shown below successively. However, before the film-formation a to d using organic materials, an evaporation mask (made of SUS, thickness: 0.2 nm) for patterned films was set up to perform the film-formation a to d (film-formation 1 to 4). Thereafter, an evaporation mask (made of SUS, thickness: 0.2 nm) for a patterned electrode was set up to perform the film-formation e (film-formation 5) by using the inorganic material. Thus, an element where each substrate has a luminous area of 4×8 mm was produced.

a. Deposition 1

Evaporation Material:
4,4',4"-tris[N-(3-methylphenyl)-N-phenylamino]triphenylamine (abbreviated to MTDATA hereinafter) as a material for a first hole injection layer, Evaporation Conditions:
ni value (n1 value): 2.05,
evaporation rate (at the center of the deposition substrate): 2.8 to 3.0 Å/s, and
film thickness: 60 nm, b. Deposition 2
Evaporation Material:
4,4'-bis[N-(1-naphthyl)-N-phenylamino]biphenyl (abbreviated to NPD hereinafter) as a material for a second hole injection layer, Evaporation Conditions:
ni value (n2 value): 2.25,
film thickness: 20 nm, and
evaporation rate: 2.2 to 2.4 Å/s, c. Deposition 3

Evaporation Material:
As materials for a luminous layer, a luminescent dopant material, 4,4'-bis[2-[4-(N,N-di-p-tolyl)phenyl]vinyl]biphenyl (abbreviated to DTAVBi hereinafter), and a luminescent host material, 4,4'-bis(2,2-diphenylvinyl)biphenyl (abbreviated to DPVBi), Evaporation Conditions:
ni value (host material, n3H value): 2.35,
ni value (dopant material, n3D value): 2.44,
evaporation rate (at the center of the deposition substrate): 1.0 Å/s,
chopper mechanism: a chopper was set up between an opening of an evaporation crucible for DTAVBi, which was the dopant material, and a shutter. The chopper was capable of making the area of the opening into 1/20.
evaporation method: two materials were simultaneously evaporated from two adjacent evaporation sources by simultaneous dual evaporation (co-evaporation), film thickness: 40 nm, d. Deposition 4

Evaporation Material:
an electron-transporting material, tris(8-quinolinol)aluminum (abbreviated to Alq hereinafter)

Evaporation Conditions:
ni value (n4 value): 2.38,
evaporation rate (at the center of the substrate): 1.0 to 1.1 Å/s, and
film thickness: 20 nm, e. Deposition 5

Evaporation Material:
An alloy material made of cathode materials Al and $L_i$ and having a $L_i$ concentration of 10 at % by atom, Evaporation Conditions:
ni value (n5 value): 6.12,
evaporation rate: 5 to 8 Å/s,
film thickness: 150 nm, and
vacuum degree upon the evaporation: $1.0 \times 10^{-4}$ Pa (2) Evaluation of Luminescence Performance of the Organic EL Element A DC voltage of 6 V was applied to the element arranged at the center of the substrate holder, selected out of the elements obtained by the above-mentioned film-forming method. As a result, an electric current of 4.16 mA/cm² flowed and blue luminescence having a brightness of 378 nit was caused. At this time, electric power conversion efficiency was 4.751 m/W, and luminescence chromaticity was (0.173, 0.258). The brightness and the luminescence chromaticity were measured according to BM-7 made of Topcon Corp. In the luminescent area of 4×8 mm□, non-luminescence points were not observed with the naked eyes. The uniformity of the luminescence was also good.

Comparative Example 1

(Formation of a Film of an Organic EL Element Wherein any ni Value was not Controlled)

An element was produced in the same way as in Example 1 except that the chopper mechanism was not used in the evaporation of the dopant material in the deposition into the luminous layer and the evaporation rate was adjusted to 0.05 Å/s by lowering the temperature of the crucible. The ni value (n3D value) of this dopant material was 6.28.

[Comparison of Luminescence Performance of the Organic EL Elements of Example 1 and Comparative Example 1 with each Other]

Figure 2:
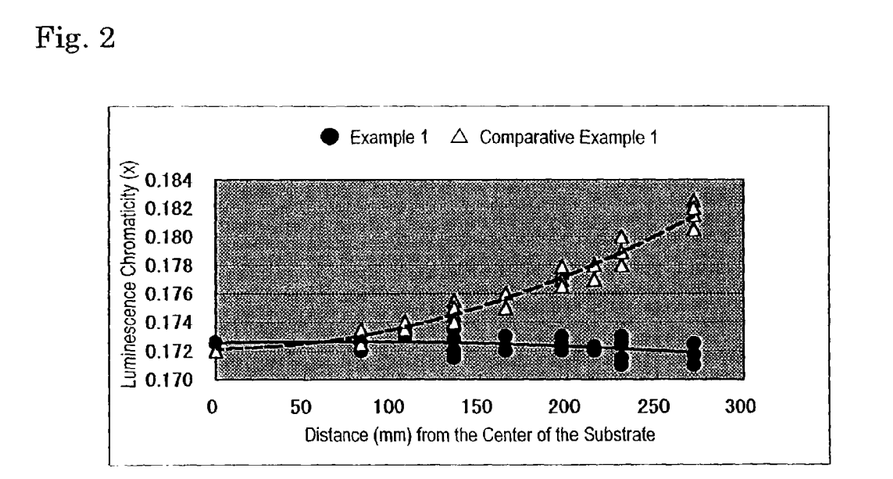
FIG. 2 is a view showing the variation of luminescence chromaticity (X axis) of organic EL elements according to film-depositing methods of Example 1 of the present invention and Comparative Example 1.
Figure 3:
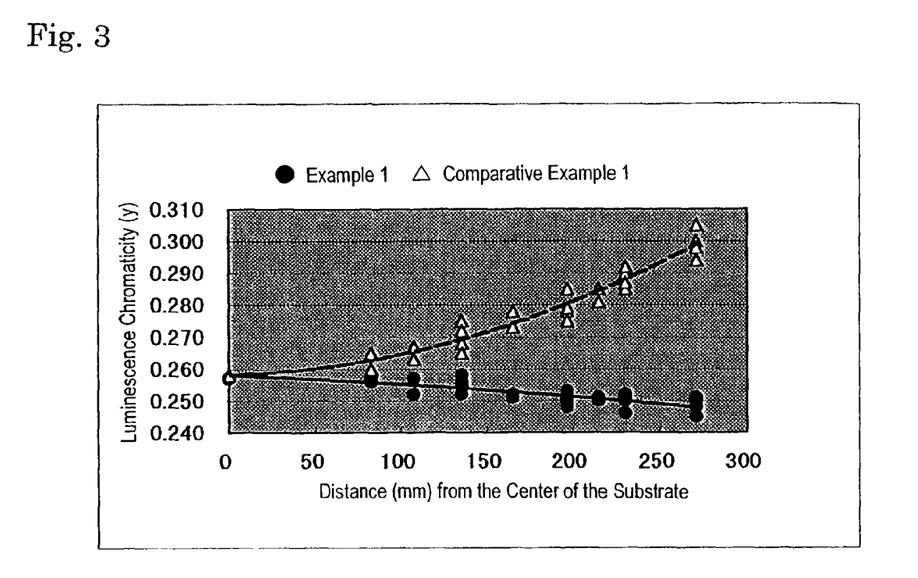
FIG. 3 is a view showing the variation of luminescence chromaticity (Y axis) of the organic EL elements according to the film-depositing methods of Example 1 of the present invention and Comparative Example 1.
Figure 4:
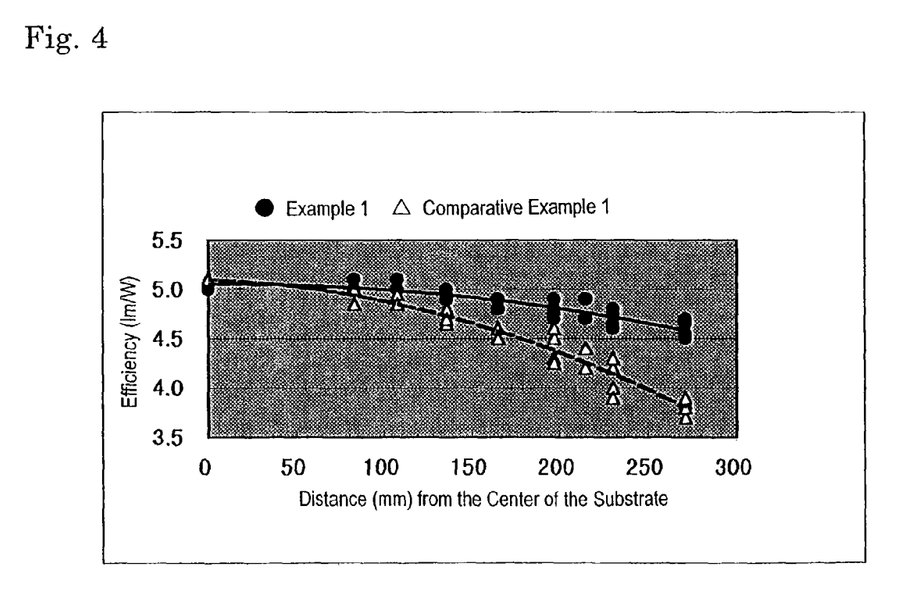
FIG. 4 is a view showing the variation of power generation conversion efficiency (efficiency) of the organic EL elements according to the film-depositing methods of Example 1 of the present invention and Comparative Example 1.

About the organic EL elements obtained in Example 1 and Comparative Example 1, changes in the X coordinate and the Y coordinate of luminescence chromaticity relative to the distance from the rotation center of the deposition substrate are shown in FIGS. 2 and 3. In the organic EL element of Example 1, luminescence color is uniform from the center of the deposition substrate to a position which is 250 mm apart from the center. Substantial changes in the X coordinate and the Y coordinate are about 0.01 and about 0.01, respectively. About a change in the electric power conversion efficiency (1 m/W) relative to the distance from the center of the deposition substrate, shown in FIG. 4, it can be understood that a change in the luminescence efficiency from the center of the substrate to the position which is 250 mm apart from the center was within 10% and uniform.

On the other hand, in the organic EL element of Comparative Example 1, changes in the X coordinate and the Y coordinate of luminescence chromaticity from the center of the deposition substrate to the position which is 250 mm apart from the center are 0.008 and 0.033, respectively. For example, when the element at a position which is 230 mm apart from the center of the substrate of Comparative Example 1 is compared with the element of Example 1, the element of Comparative Example 1 had a changed luminescence chromaticity. Its luminescence color is greenish.

A change in the electric power conversion efficiency (lm/W) relative to the distance from the center of the deposition substrate is about 20% at a position where the distance is 250 mm.

Example 2

(Formation of a Film of an Organic EL Element While the ni Value was Controlled, and Evaluation II of Luminescence Performance of the Resultant Element: Non-Rotation Evaporation Method)

There was used a vacuum evaporation machine wherein the distance between a deposition substrate, which was capable of being rotated to be positioned just above the following six evaporation sources and being positioned (fixed), and an evaporation source holder was 500 mm, and the following formation of an organic EL element into a film was performed. Evaporation sources wherein the same 6 materials as in Example 1 were put into the crucible used in Example 1 were arranged along a concentric circuit on the evaporation source holder, the center of which was at a intersection point of the evaporation source holder and a perpendicular line extended downwards from the center of the deposition substrate to the evaporation source holder. Glass substrates 1 and 2, each of which had deposited ITO having a thickness of 120 nm, were loaded at the intersection point of the deposition substrate and the perpendicular line at the point where the evaporation sources on the evaporation source holder were positioned, and at a position which was present on the deposition substrate and was 10 cm apart from this intersection point toward the center, respectively. Evacuation was performed until the degree of vacuum was $2 \times 10^{-4}$ Pa or less. Thereafter, the evaporation sources of the 6 kinds of materials to be deposited were fixed, one by one, to a position just under the glass substrate 1, so as to form films. Evaporation conditions in the formation of the respective films were the same as in Example 1. In the formation of the films, therefore, the glass substrate 1 on the deposition substrate was always present on perpendicular lines of the respective evaporation sources. The glass substrate 2 was present at the position which was 10 cm apart from the glass substrate 1 toward the center. The formations of the films were performed in the state that the evaporation sources and the glass substrates were fixed. In deposition 3, a chopper mechanism was set up in the same way as in Example 1. Furthermore, a patterning mask was also set up in the same way as in Example 1.

In this manner, an element 1 (which was on the perpendicular lines of the evaporation sources) and an element 2 (which was 10 cm apart from the element 1 toward the center), each of which had a luminous area having a size of 4×8 mm, were obtained. The film thicknesses of the organic material layers of the two, the difference between the film thicknesses, and the change rate thereof are shown in Table 2, and the luminescence efficiencies of the two, the difference between the luminescence efficiencies, and the change rate thereof are shown in Table 3.

Comparative Example 2

(Formation of a Film of an Organic EL Element Wherein the ni Value was not Controlled: Non-Rotation Evaporation Method)

By vacuum evaporation, a film of an organic EL element according to the film-formations 1 to 5 was formed in the same way as in Example 2 except that the evaporation conditions of the film-formation 1 in Example 2 were made to the following. In the film-formation 1, however, the material was the same as in Example 2.

Evaporation Conditions:

A boat made of molybdenum and having an opening diameter of 1 mm, a thickness of 0.5 mm and a depth of 10 mm was used instead of the crucible made of graphite and having an opening diameter of 25 mm, a thickness of 1.6 mm and a depth of 70 mm.

ni value (n1 value): 4.82,
evaporation rate (at the center of the deposition substrate): 0.8 to 1.2 Å/s,
boat temperature: 325° C., and
film thickness: 60 nm In this manner, an element 1 (which was on the perpendicular lines of the evaporation sources) and an element 2 (which was 10 cm apart from the element 1 toward the center), each of which had a luminous area having a size of 4×8 mm, were obtained. The film thicknesses of the organic material layers of the two, the difference between the film thicknesses, and the change rate thereof were shown in Table 2, and the luminescence efficiencies of the two, the difference between the luminescence efficiencies, and the change rate thereof are shown in Table 3.

TABLE 2

|  | Example 2 | Comparative Example 2 |
|---|---|---|
| Film thickness of the organic layer of the element 1: nm | 139 | 140 |
| Film thickness of the organic layer of the element 2: nm | 133 | 125 |
| Difference of film thickness: nm (Change rate of the film thickness) | 6 (4.3%) | 15 (10.7%) |

TABLE 3

|  | Example 2 | Comparative Example 2 |
|---|---|---|
| Luminescence efficiency of the element 1: cd/A | 9.8 | 9.7 |
| Luminescence efficiency of the element 2: cd/A | 9.7 | 6.8 |
| Difference between the luminescence efficiencies: cd/A (Change rate of the luminescence efficiency) | 0.1 (1.0%) | 2.9 (29.9%) |

[Comparison of Luminescence Performances and so on of the Organic EL Element of Example 2 with Those of the Organic EL Element of Comparative Example 2]

From Tables 2 and 3, about the organic EL element obtained by the non-rotation evaporation method in Example 2, wherein the ni value at the time of forming the organic layers were controlled, its change rate of the film thickness was 5% or less and its change in luminescence efficiency was 1% even if the organic EL element was 10 cm apart. On the other hand, about the organic EL element obtained by the non-rotation evaporation method in Comparative Example 2, wherein the ni value was set to 4.82 in the film-formation 1, its change rate of the film thickness was 10% or more and its change in luminescence efficiency was about 30%. Therefore, in the case of depositing many layers while the ni value is controlled, it is possible to obtain a homogenous element wherein the variation of the film thickness at respective positions on a deposition substrate and luminescence efficiency are small.

INDUSTRIAL APPLICABILITY

According to the method for depositing a thin film layer for an element of the present invention, a homogeneous film can be formed even on a deposition substrate having a large screen. The homogeneity is high. In the case of depositing many layers into a lamination, change in the film thickness of each of the films is small at respective positions on a deposition substrate. In the case of co-evaporating plural materials, a film wherein change in the density of each of the materials is small at respective positions on a deposition substrate can be obtained.

Organic EL elements produced in such a method are homogenous with a small variation of luminescence performance at respective positions in the elements.

What is claimed is:

1. An organic electroluminescence element comprising organic layers formed by depositing two or more organic materials by vacuum evaporation, comprising, depositing each material under such control that an ni value of each organic material is k±0.5 wherein k is a constant from 2 to 5, when a relationship between a deposition position and a film thickness of a material i on the substrate is approximated by the following equation (1):

$$D_i/D_{0i} \alpha (L_0/L_i)^3 \cos^{ni} \theta_i \quad (1)$$

wherein $L_0$ is a distance from an evaporation source to a plane of the substrate in a perpendicular direction, $D_{0i}$ is a film thickness of the material i at an intersection point of a perpendicular line from the evaporation source to the plane of the substrate, and $D_i$ is a film thickness of the material i at a position on the substrate that is apart from the evaporation source by a distance $L_i$ in a direction of an angle $\theta_i$ against the perpendicular line.

2. The organic electroluminescence element according to claim 1, wherein a variation of an X coordinate of CIE luminescence chromaticity is 0.005/250 mm or less and a variation of a Y coordinate thereof is 0.02/250 mm or less.

3. The organic electroluminescence element according to claim 2, wherein a variation of electric power conversion efficiency is 15%/250 mm or less.

4. The organic electroluminescence element according to claim 1, wherein a variation of electric power conversion efficiency is 15%/250 mm or less.

5. The organic electroluminescence element comprising a luminous layer formed by depositing a host material and a dopant material of a luminous layer of an organic electroluminescence element by vacuum evaporation, comprising, co-depositing each material under such control that an ni value of each material is k±0.5 wherein k is a constant from 2 to 5, when a relationship between a deposition position and a film thickness of a material i on the substrate is approximated by the following equation (1):

$$D_i/D_{0i} \alpha (L_0/L_i)^3 \cos^{ni} \theta_i \quad (1)$$

wherein $L_0$ is a distance from an evaporation source to a plane of the substrate in a perpendicular direction, $D_{0i}$ is a film thickness of the material i at an intersection point of a perpendicular line from the evaporation source to the plane of the substrate, and $D_i$ is a film thickness of the material i at a position on the substrate that is apart from the evaporation source by a distance $L_i$ in a direction of an angle $\theta_i$ against the perpendicular line.

6. The organic electroluminescence element according to claim 5, wherein a variation of an X coordinate of CIE luminescence chromaticity is 0.005/250 mm or less and a variation of a Y coordinate thereof is 0.02/250 mm or less.

7. The organic electroluminescence element according to claim 5, wherein a variation of electric power conversion efficiency is 15%/250 mm or less.

* * * * *